United States Patent [19]
Yang et al.

[11] Patent Number: 6,159,860
[45] Date of Patent: *Dec. 12, 2000

[54] METHOD FOR ETCHING LAYERS ON A SEMICONDUCTOR WAFER IN A SINGLE ETCHING CHAMBER

[75] Inventors: Wenge Yang, Fremont; Lewis Shen, Cupertino, both of Calif.

[73] Assignee: Advanced Micro Devices, Inc., Sunnyvale, Calif.

[*] Notice: This patent issued on a continued prosecution application filed under 37 CFR 1.53(d), and is subject to the twenty year patent term provisions of 35 U.S.C. 154(a)(2).

[21] Appl. No.: 09/118,375

[22] Filed: Jul. 17, 1998

[51] Int. Cl.[7] .................... H01L 21/302; H01L 21/461
[52] U.S. Cl. .................. 438/706; 438/719; 438/721; 438/723; 438/738
[58] Field of Search .................................. 438/706, 709, 438/710, 738, 749

[56] References Cited

U.S. PATENT DOCUMENTS

| | | | |
|---|---|---|---|
| 5,094,712 | 3/1992 | Becker et al. | 438/738 |
| 5,169,487 | 12/1992 | Langley et al. | 438/738 |
| 5,201,993 | 4/1993 | Langley | 438/738 |
| 5,346,586 | 9/1994 | Keller | 438/738 |
| 5,378,311 | 1/1995 | Nagayama | 438/710 |
| 5,795,829 | 8/1998 | Shen | 438/694 |
| 5,897,354 | 4/1999 | Kachelmeier | 438/264 |

*Primary Examiner*—Benjamin L. Utech
*Assistant Examiner*—Duy-Vu Deo

[57] ABSTRACT

Polysilicon and oxide layers on a semiconductor wafer are etched in a single etching chamber configured for selectively providing a first etching environment in the chamber for etching of the polysilicon layer, and a second etching environment in the chamber for etching the oxide layer. The decoupled plasma source polysilicon etch chamber enables etching of both oxide-based layers and silicon-based layers, without removing the semiconductor wafer from the etching chamber.

5 Claims, 4 Drawing Sheets

METHOD FOR ETCHING LAYERS ON A SEMICONDUCTOR WAFER IN A SINGLE ETCHING CHAMBER

BACKGROUND OF THE INVENTION

1. Technical Field

The present invention relates to semiconductor devices and manufacturing processes, and more particularly to methods and arrangements associated with a multipurpose graded silicon oxynitride cap layer in non-volatile memory semiconductor devices.

2. Background Art

A continuing trend in semiconductor technology is to build integrated circuits with more and/or faster semiconductor devices. The drive toward this ultra large-scale integration (ULSI) has resulted in continued shrinking of devices and circuit features. As the devices and features shrink, new problems are discovered that require new methods of fabrication and/or new arrangements.

A flash or block erase Electrically Erasable Programmable Read Only Memory (flash EEPROM) semiconductor memory includes an array of memory cells that can be independently programmed and read. The size of each memory cell, and therefore the memory array is reduced by omitting select transistors that would enable the cells to be erased independently. The array of memory cells is typically aligned along a bit line and a word line and erased together as a block. An example of a memory of this type includes individual metal oxide semiconductor (MOS) memory cells, each of which includes a source drain, floating gate, and control gate to which various voltages are applied to program the cell with a binary 1 or 0. Each memory cell can be read by addressing it via the appropriate word and bit lines.

An exemplary memory cell 8 is depicted in FIG. 1A, viewed in a cross-section through the bit line. Memory cell 8 includes a doped substrate 12 having a top surface 11, and a source 13a and a drain 13b formed by selectively doping regions of substrate 12. A tunnel oxide 15 separates a floating gate 16 from substrate 12. An interpoly dielectric 24 separates floating gate 16 from a control gate 26. Floating gate 16 and control gate 26 are each electrically conductive and typically formed of polysilicon.

On top of control gate 26 is a silicide layer 28, which acts to increase the electrical conductivity of control gate 26. Silicide layer 28 is typically a tungsten silicide (e.g., $WSi_2$), that is formed on top of control gate 26 prior to patterning, using conventional deposition and annealing processes.

As known to those skilled in the art, memory cell 8 can be programmed, for example, by applying an appropriate programming voltage to control gate 26. Similarly, memory cell 8 can be erased, for example, by applying an appropriate erasure voltage to source 13a. When programmed, floating gate 16 will have a charge corresponding to either a binary 1 or 0. By way of example, floating gate 16 can be programmed to a binary 1 by applying a programming voltage to control gate 26, which causes an electrical charge to build up on floating gate 16. If floating gate 16 does not contain a threshold level of electrical charge, then floating gate 16 represents a binary 0. During erasure, the charge is removed from floating gate 16 by way of the erasure voltage applied to source 13a.

FIG. 1B depicts a cross-section of several adjacent memory cells from the perspective of a cross-section through the word line (i.e., from perspective A, as referenced in FIG. 1A). In FIG. 1B, the cross-section reveals that individual memory cells are separated by isolating regions of silicon dioxide formed on substrate 12. For example, FIG. 1B shows a portion of a floating gate 16a associated with a first memory cell, a floating gate 16b associated with a second memory cell, and a floating gate 16c associated with a third memory cell. Floating gate 16a is physically separated and electrically isolated from floating gate 16b by a field oxide (FOX) 14a. Floating gate 16b is separated from floating gate 16c by a field oxide 14b. Floating gates 16a, 16b, and 16c are typically formed by selectively patterning a single conformal layer of polysilicon that was deposited over the exposed portions of substrate 12, tunnel oxide 15, and field oxides 14a and 14b. Interpoly dielectric layer 24 has been conformally deposited over the exposed portions of floating gates 16a, 16b, and 16c and field oxides 14a and 14b. Interpoly dielectric layer 24 isolates floating gates 16a, 16b and 16c from the next conformal layer which is typically a polysilicon layer that is patterned (e.g., along the bit line) to form control gate 26. Interpoly dielectric layer 24 typically includes a plurality of films, such as, for example, a bottom film of silicon dioxide, a middle film of silicon nitride, and a top film of silicon dioxide. This type of interpoly dielectric layer is commonly referred to as an oxide-nitride-oxide (ONO) layer.

The continued shrinking of the memory cells, and in particular the basic features depicted in the memory cells of FIGS. 1A and 1B, placed a burden on the fabrication process to deposit and subsequently pattern a layer stack to form a floating gate/control gate structure, without creating deleterious effects within the resulting memory cells.

In particular, the reduction in critical dimensions reduces the yield of semiconductor wafers using conventional processes to form reduced-size memory devices due to the sequential processing technique used during fabrication.

FIG. 3 is a flow diagram illustrating a conventional process for etching a semiconductor wafer to form the memory gate stack 10 of FIG. 2. The method begins in step 40, where the multi-layer semiconductor wafer including the polysilicon layer 16, the ONO layer 24, the polysilicon layer 26, the silicide layer 28, and an oxide cap layer 30 overlying the silicide layer is covered with a photoresist layer. The photoresist layer is patterned in step 42 to form a mask to form the memory gate in step 42. The semiconductor wafer is then inserted into an oxide etch chamber in step 44, and an oxide etching operation is performed on the regions of the silicon oxynitride layer exposed by the mask. The semiconductor wafer is then moved in step 46 from the oxide etch chamber to a polysilicon etch chamber, where polysilicon etch processing is performed on the suicide layer 28 and the polysilicon layer 26. The semiconductor wafer is then removed from the polysilicon etch chamber and cleaned in step 48 to remove any remaining resist, and polymers remaining during the etching process. For example, the resist and sidewalls of the etched semiconductor may be cleaned using a hydrofluoric acid dip, plus a dry plasma ($O_2$) clean, followed by a sulfuric acid bath. Following cleaning, another mask is formed in step 50 to cover areas that are not part of a memory core. The masked wafer is then moved to an oxide etch chamber in step 52 for etching of the ONO layer 24. Once the ONO layer 24 is etched, the semiconductor wafer is once again moved in step 54 to a polysilicon etch chamber in step 54 for etching of the polysilicon layer 16, followed by cleaning of the mask in step 56.

Hence, the conventional technique for forming the memory gate requires a substantial amount of etching in different etching chambers. Such processes require a substantial amount of handling of the semiconductor wafers, risking contamination of the wafer during transfers between etching chambers. In addition, the control of process parameters is reduced due to the movement of the semiconductor wafer between chambers during etching.

SUMMARY OF THE INVENTION

There is a need for a method for etching a semiconductor wafer for ULSI integration that minimizes process variations during etching operations.

There is also a need for a method for forming a semiconductor memory gate from a semiconductor wafer having oxide-based layers and silicon-based layers in a manner that minimizes the transfer of the semiconductor wafer between etching chambers.

These and other needs are attained by the present invention, where a decoupled plasma source polysilicon etch chamber is used to etch multiple layers in the semiconductor wafer by selectively changing the etching environment for different layers. Hence, both oxide-based layers and silicon-based layers on a semiconductor wafer may be etched using respective selected etching environments, without removing the semiconductor wafer from the etching chamber.

According to one aspect of the present invention, a method etches a semiconductor wafer having layers formed a silicon substrate. The layers of the semiconductor wafer include at least an oxide-based layer and a silicon-based layer overlying the silicon substrate. The method includes first etching one of the oxide-based layer and the silicon-based layer in an etching chamber according to a first selected etching environment, and second etching another one of the layers contiguously following the first etching step, in the etching chamber according to a second selected etching environment. The performance of the second etching step contiguously following the first etching step of a second layer having semiconductor properties distinct from the layer etched in the first etching environment enables high density semiconductor structures to be formed by performing multiple etching steps in the same etching chamber, without the need for removing the semiconductor wafer between etching steps. Rather, the semiconductor wafer remains within the etching chamber through successive etching steps, where the etching environment in the etching chamber is changed depending on the layer to be etched.

Another aspect of the present invention provides a method of etching layers overlying on a silicon substrate, where the layers include at least an oxide-based layer and a silicon-based layer. The method includes setting an etching chamber to a first etching environment, first etching one of the oxide-based layer and the silicon-based layer in the etching chamber according to the first etching environment, setting the etching chamber to a second etching environment, and second etching another one of the oxide-based layer and the silicon-based layer in the etching chamber according to the second etching environment and contiguously following the first etching step. The setting of the etching chamber to different etching environments enables the semiconductor wafer to remain in the same etching chamber for etching of different layers, improving the efficiency and process control by minimizing the steps necessary to move the semiconductor wafer in the fabrication sequence. Hence, the environment of the semiconductor wafer may be precisely controlled throughout the etching process, minimizing process variables and improving yield during formation of ULSI semiconductor devices.

Still another aspect of the present invention provides a system for etching a semiconductor wafer having at least an oxide layer and a polysilicon layer, the system comprising a chamber for enclosing the semiconductor wafer during etching, and a control for selectively providing a first etching environment in the chamber for etching the polysilicon layer, and a second etching environment in the chamber for etching the oxide layer.

Additional objects, advantages and novel features of the invention will be set forth in part in the description which follows, and in part may become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

Reference is made to the attached drawings, wherein elements having the same reference numeral designations represent like elements throughout and wherein.

BEST MODE FOR CARRYING OUT THE INVENTION

Figure 1A:
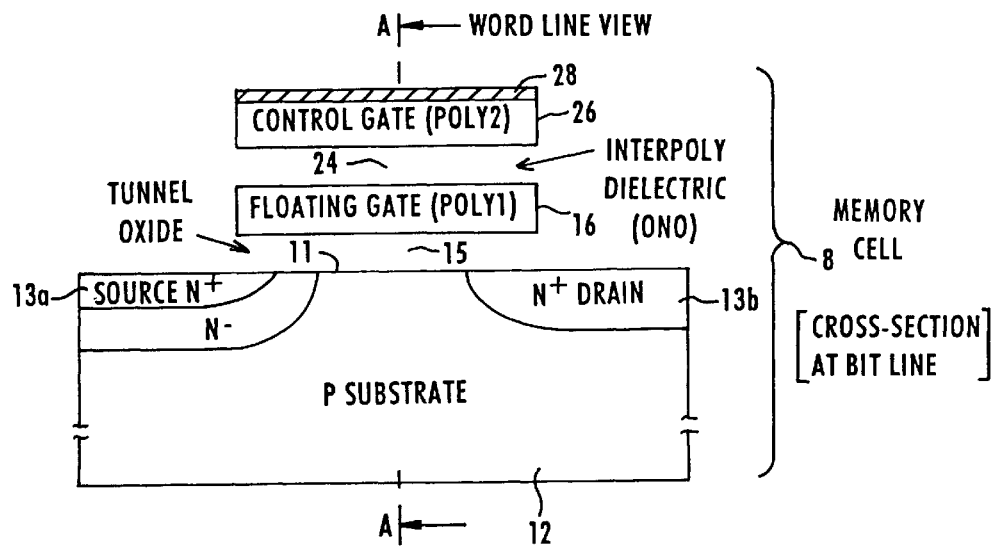
FIGS. 1A and 1B are diagrams illustrating cross-sectional views of a portion of a conventional semiconductor device memory cell along bit-line and word-line views, respectively.
Figure 1B:
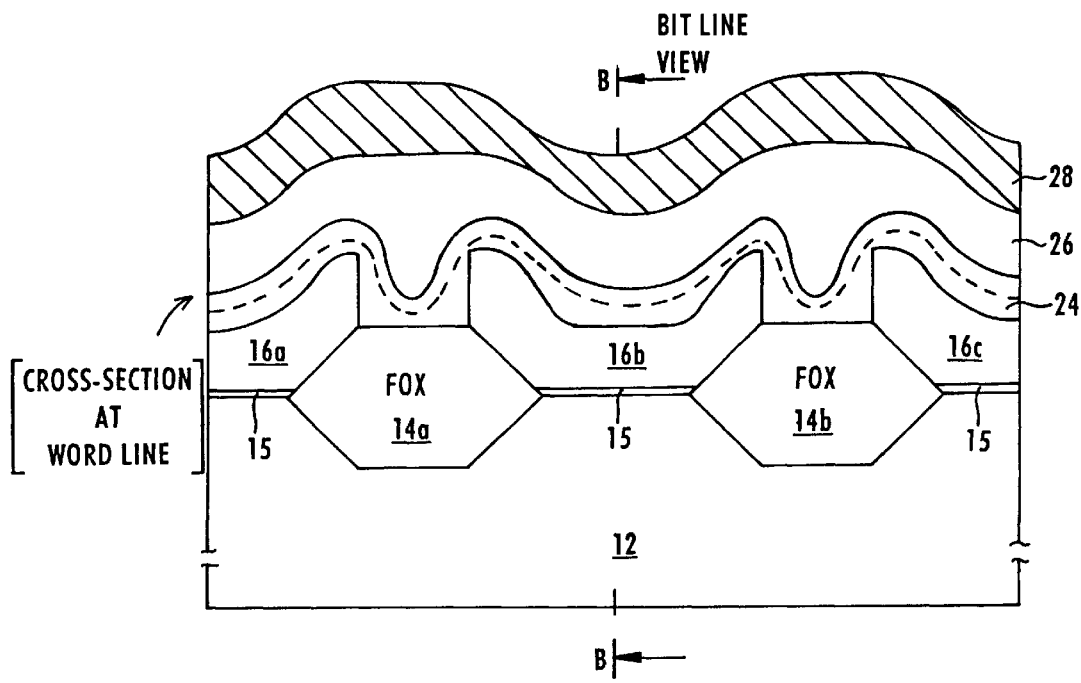
Figure 2:
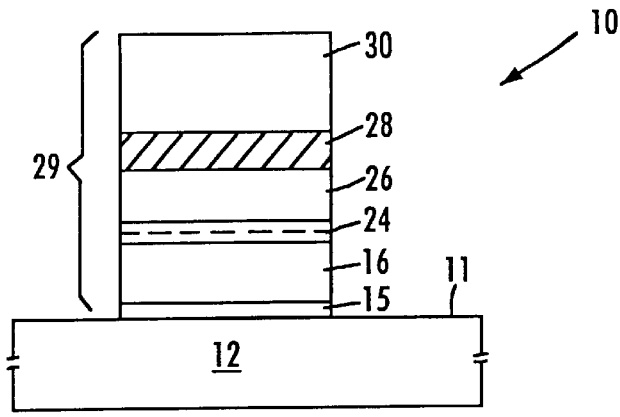
FIG. 2 is a diagram illustrating a cross-section of a portion of a semiconductor device having a patterned conventional layer stack that includes an oxide cap layer.
Figure 3:
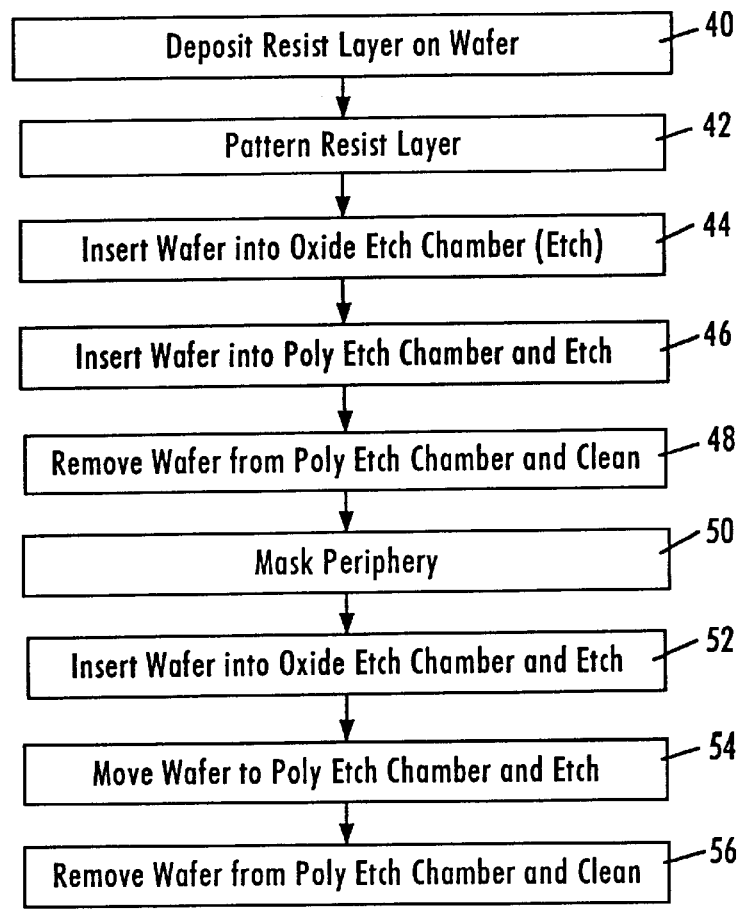
FIG. 3 is a diagram illustrating a conventional prior art method for forming a memory gate.
Figure 4:
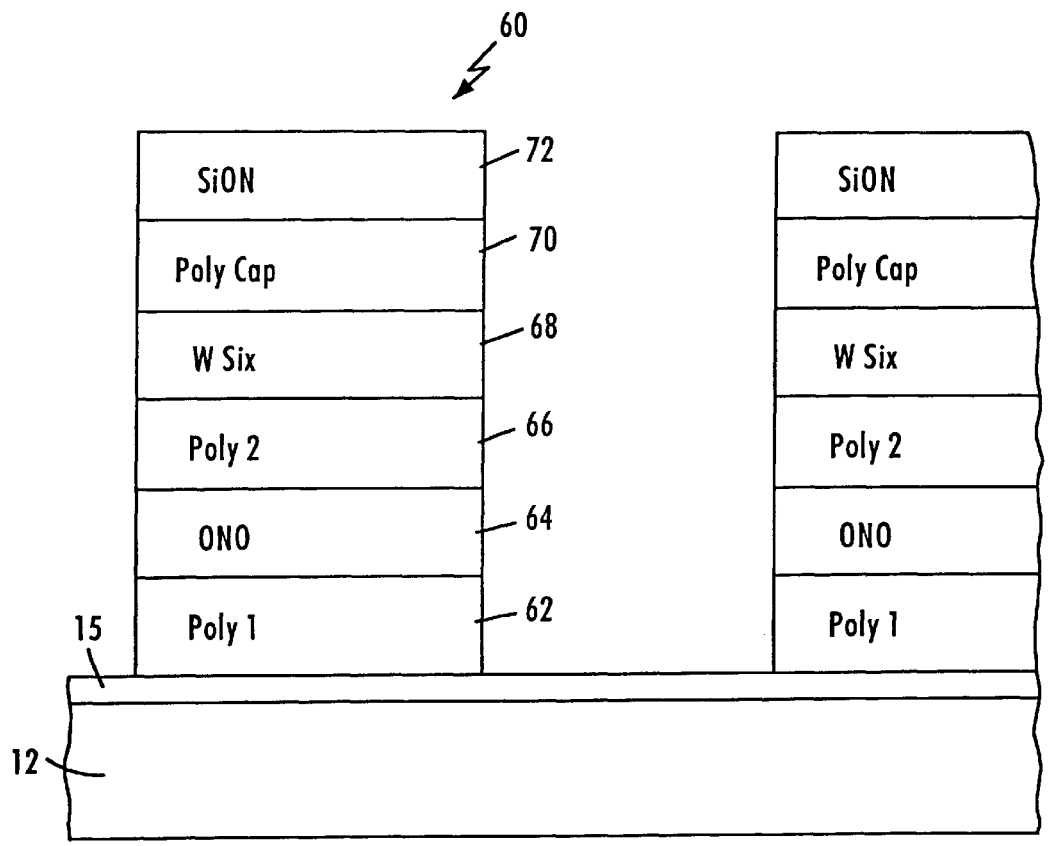
FIG. 4 is a diagram illustrating a cross-sectional view of a semiconductor device memory gate having a patterned stack layer that includes a polysilicon cap layer and a silicon oxynitride stop layer.

FIG. 4 is a diagram of a layer stack 60 having a plurality of layers formed on a silicon substrate 12. The layers 60 include a tunnel oxide layer 15 overlying on the silicon substrate 12, a first polysilicon layer 62 overlying on the tunnel oxide layer 15, and an oxide-nitride-oxide (ONO) layer 64 overlying on the first polysilicon layer 62. The stack 60 also includes a second polysilicon layer 66 overlying on the ONO layer 64, a silicide ($WSi_x$) layer overlying on the second polysilicon layer 66, a polysilicon cap layer 70 overlying on the silicide layer 68, and a silicon oxynitride (SiON) layer 72 overlying on the polysilicon cap layer 70. The silicon oxynitride layer 72 serves as an antireflective coating (ARC) layer, and hence may be used for many reduced-size critical dimension semiconductor devices. Both the polysilicon cap layer 70 and the silicon oxynitride layer 72 are deposited using conventional chemical vapor deposition (CVD) or plasma enhanced chemical vapor deposition (PECVD) techniques. The polysilicon cap layer 70 typically includes undoped polysilicon and has a thickness of about 500 Angstroms. The silicon oxynitride layer 72 includes silicon oxynitride (e.g., $SiO_x$, $N_y$ (wherein x and y represent the atomic percentage of oxygen and nitrogen, respectively) and has a thickness of about 400 Angstroms.

The layer stack 60 is configured for submicron memory gates, and has a height of between about 3,500 Angstroms to about 5,000 Angstroms. The tunnel oxide layer 15 is about 50 Angstroms thick, and is thermally grown on substrate 12.

The polysilicon layer 62 is a doped polysilicon layer formed on the tunnel oxide 15 using conventional CVD or PECVD techniques to a thickness of about 900 to about 1,100 Angstroms, and is used in the memory gate as the floating polysilicon gate. The interpoly dielectric layer (ONO) 64 is then formed overlying on the polysilicon layer 62 using conventional deposition techniques to a thickness of about 150 to 200 Angstroms total. As recognized in the art, the ONO layer 64 may be formed by a three-stage process including forming a first film of silicon dioxide on the polysilicon layer 62, depositing a film of silicon nitride on the silicon dioxide, and then depositing a second film of silicon dioxide on the silicon nitride film.

The polysilicon layer 66 is then deposited on the ONO layer 64 to a thickness of about 1,200 Angstroms. The silicide layer 68 is then formed using conventional silicide forming techniques to a thickness of about 1,100 to 1,700 Angstroms. The poly cap layer 70 is then formed to a thickness of about 500 Angstroms.

The silicon oxynitride layer is then deposited overlying on the poly cap layer 70. Although the preferred embodiment uses silicon oxynitride as the antireflective coating layer 72, alternative cap layer materials may be used that include a controllable atomic percentage of nitrogen, for example, silicon oxime.

According to the disclosed embodiment, the layers 60 are selectively etched in order to form the memory gate structure disclosed in FIG. 4 using a single-chamber etching process. In particular, the preferred embodiment uses a decoupled plasma source (DPS) poly chamber from Applied Materials, Inc., Santa Clara, Calif., for example an Applied Materials AMAT DPS Poly chamber. The "DPS" refers to a decoupled plasma source. Normal plasma etch tools use a single power, referred to as a source power, with the wafers electrically grounded; alternately, the wafers may be attached to the source power, and the chamber is electrically grounded. The plasma etch tool controls the source power and affects how much plasma is generated, and also controls the concentration of reactive species, and hence how the reactive species lands on the wafer.

In the decoupled plasma source etcher, the power is separated into a source power, which is a high power supplied to the chamber wall. Another power is connected to the wafer, referred to as bias power, or bottom power. The source power ionizes the gas supplied into the chamber, and generates the reactive species in the chamber. The bias power on the wafer drives the reactive species to accelerate the reactions. Hence, there is more control of the etching process: the source power controls generation of the chemical species and therefore controls the chemical etch portion, and the bias power controls the physical part of the etch, for example the bombardment of the species onto the wafer.

Figure 5:
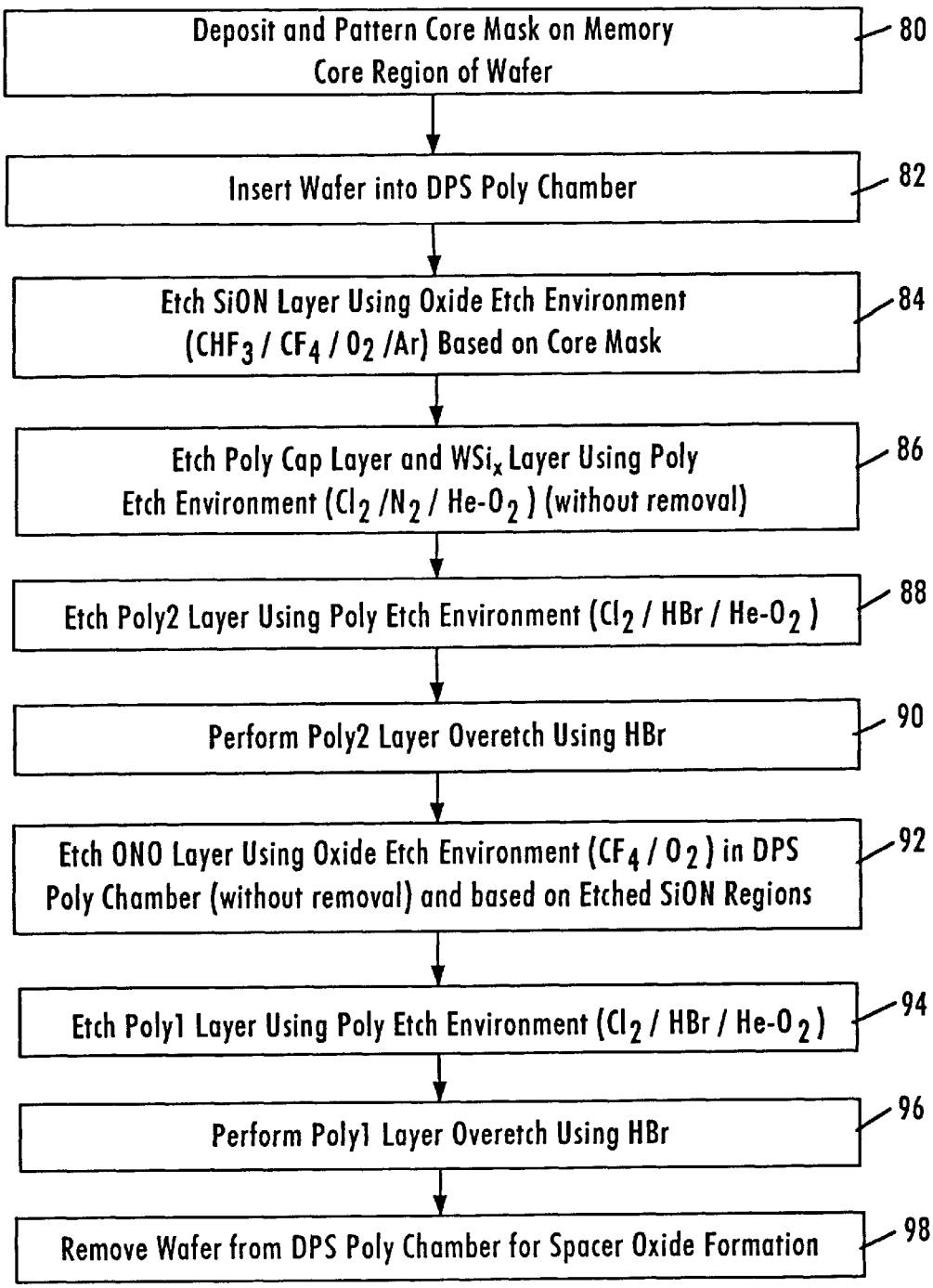
FIG. 5 is a diagram of a method of etching a semiconductor wafer to form the memory gate of FIG. 4 according to an embodiment of the present invention.

FIG. 5 is a flow diagram summarizing the method for etching a semiconductor wafer having multiple layers to form the memory gate 60 according to an embodiment of the present invention. As shown in FIG. 5, the semiconductor wafers having the layers 15, 62, 64, 66, 68, 70, and 72 on the silicon substrate 12 are patterned with enhanced deep-UV (DUV) submicron photolithography techniques to form a core mask defining a memory core region of the semiconductor wafer in step 80. The core mask defines the memory core region that requires submicron critical dimensions, as distinguished from periphery devices such as analog drivers that do not require as stringent critical dimensions.

Once the core mask has been formed on the semiconductor wafer, the semiconductor wafer is inserted in step 82 into a DPS poly chamber. According to the disclosed embodiment, the DPS poly chamber has the feature of etching from a plurality of different etching environments, including oxide etching environments and polysilicon etching environments. Hence, the semiconductor wafer may remain in the DPS poly chamber during etching from the silicon oxynitride layer 72 down to the tunnel oxide layer 15, without removing the semiconductor wafer from the DPS poly chamber.

The semiconductor wafer is then etched in step 84 using an oxide etch environment, for example an environment containing $CHF_3$, $CF_4$, oxygen ($O_2$), and Ar, having relative percentages of about 20, 20, 10, and 50, respectively. The polysilicon cap layer 70 and the silicide layer 68 are then etched in the DPS poly chamber, without removing the semiconductor wafer, using a polysilicon etch environment in step 86. The polysilicon etch environment has an exemplary composition of $Cl_2$, $N_2$, and He—$O_2$ in relative percentages of about 90, 5, and 5, respectively. The poly2 layer 66, used as the control gate in the memory gate, is then etched in the DPS poly chamber in step 88 using the same poly etch environment of step 86. An overetch of the poly2 layer 66 is then performed in step 90 using HBr. The overetching of the poly2 layer 66 in step 90 provides a better landing surface onto the ONO layer 64.

The interpoly layer 64 is then etched in step 92 using an oxide etch environment, for example $CF_4$ and $O_2$ having relative percentages of 70 and 30, respectively. The etching in step 92 is a self-aligned etch, in the sense that the etched silicon oxynitride layer 72 is used as the mask for the etching of layers 64 and 62. Hence, the semiconductor wafer may encounter repeated etching operations, even though the original resist mask formed in step 80 may have degraded due to the successive etching operations in steps 84, 86, 88, and 90.

Following etching of the ONO layer 64, the poly1 layer 62 is etched in step 94 using the same poly etch environment chemistry as step 86, followed by a poly1 layer overetch in step 96 using HBr, exposing the tunnel oxide layer 15.

Following the etching of the stack to expose the tunnel layer 15, the wafer can be removed from the DPS poly chamber in step 98 for spacer oxide formation in completion of forming the memory gate.

According to the disclosed embodiment, a single etch chamber is used to etch a plurality of layers in forming a memory gate. The etching chamber is configured for etching the semiconductor wafer by selectively changing the chemistries (i.e., etching environments), eliminating the necessity for repeated movement of the semiconductor wafer between different semiconductor processing chambers. Moreover, the use of photolithography in combination with self-aligned etching using the etched silicon oxynitride layer 72 as a mask enables the entire stack 60 to be etched in a single etching chamber.

According to the disclosed embodiment, the Applied Materials AMAT DPS poly etcher is used to etch both polysilicon and oxide layers. Although the manufacturer only suggests using the oxide-etch chemistries for cleaning the chamber, the inventors have discovered that the oxide-etch chemistries can be used for oxide etching for integration as well. Hence, the oxide-etch chemistries used for cleaning the chamber can actually be used for process integration, such that both oxide-etch and polysilicon etch in a semiconductor wafer can be performed in the same polysilicon chamber.

An additional benefit is that the etch chamber is cleaned every time an etch is performed for every single wafer. In addition, the disclosed arrangement provides a much more efficient procedure for controlling the rectangular profile of the etching processes. The DPS poly etcher etches anisotropically. In particular, the DPS poly etcher has independent bias power control, and very low pressure, enabling ions to penetrate with a much higher energy. Finally, the disclosed arrangement provides a significant cost saving, since the number of overall etching steps of the semiconductor wafer is substantially reduced.

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit device during fabrication are not drawn to scale, but instead are drawn to illustrate the features of the present invention.

While this invention has been described in connection with what is presently considered to be the most practical and preferred embodiments, it is to be understood that the invention is not limited to the disclosed embodiments, but, on the contrary, is intended to cover various modifications and equivalent arrangements included within the spirit and scope of the appended claims.

What is claimed is:

1. A method of etching a semiconductor wafer having layers formed on a silicon substrate, the layers including at least an antireflective layer, a polysilicon cap layer, a silicide layer, a second polysilicon layer, an interpoly dielectric layer, and a first polysilicon layer overlying the silicon substrate, the method comprising:

providing an etching chamber configured for providing a first, second, third, fourth and fifth etching environments;

first etching the antireflective coating layer in the etching chamber;

second etching the polysilicon cap layer and the silicide layer in the chamber confi;

third etching the second polysilicon layer;

fourth etching the interpoly dielectric layer; and, fifth etching the first polysilicon layer, wherein the successive etching steps are performed without removing the semiconductor wafer from the chamber.

2. The method of claim 1, further comprising:

forming a mask on the antireflective layer defining a memory core pattern having memory gate patterns.

3. The method of claim 1, wherein the layers formed on the silicon substrate further include a tunnel oxide layer between the silicon substrate and the first polysilicon layer.

4. The method of claim 1, wherein the antireflective coating layer is a silicon oxynitride layer.

5. The method of claim 1, wherein the chamber is a decoupled plasma source poly chamber.

* * * * *